(12) United States Patent
Fautz

(10) Patent No.: US 8,891,846 B2
(45) Date of Patent: Nov. 18, 2014

(54) CORRECTION OF CHANGING LOCAL TRANSMIT PHASES DURING PARALLEL TRANSMISSION

(75) Inventor: Hans-Peter Fautz, Forchheim (DE)

(73) Assignee: Siemens Aktiengesellschaft, München (DE)

( * ) Notice: Subject to any disclaimer, the term of this patent is extended or adjusted under 35 U.S.C. 154(b) by 882 days.

(21) Appl. No.: 13/077,908

(22) Filed: Mar. 31, 2011

(65) Prior Publication Data

US 2011/0243420 A1 Oct. 6, 2011

(30) Foreign Application Priority Data

Apr. 1, 2010 (DE) .......................... 10 2010 013 681

(51) Int. Cl.
*G06K 9/00* (2006.01)
*G01R 33/565* (2006.01)
*G01R 33/561* (2006.01)

(52) U.S. Cl.
CPC ........ *G01R 33/5612* (2013.01); *G01R 33/5659* (2013.01)
USPC ........... 382/131; 382/128; 382/254; 382/275; 324/300; 600/407; 600/410

(58) Field of Classification Search
None
See application file for complete search history.

(56) References Cited

U.S. PATENT DOCUMENTS

| | | | |
|---|---|---|---|
| 5,869,965 A | 2/1999 | Du et al. | |
| 6,466,015 B2 * | 10/2002 | Schaeffter et al. | 324/309 |
| 6,560,353 B1 * | 5/2003 | Haacke et al. | 382/128 |
| 7,285,954 B2 * | 10/2007 | Nezafat et al. | 324/309 |
| 7,592,813 B2 | 9/2009 | Boskamp et al. | |
| 7,847,551 B2 * | 12/2010 | Park | 324/309 |
| 2002/0048340 A1 * | 4/2002 | Schaeffter et al. | 378/21 |
| 2002/0082497 A1 * | 6/2002 | Song | 600/410 |
| 2002/0190714 A1 * | 12/2002 | Bernstein | 324/307 |
| 2007/0108976 A1 | 5/2007 | Morich et al. | |
| 2007/0229075 A1 | 10/2007 | Ookawa et al. | |
| 2008/0297153 A1 | 12/2008 | Nozaki | |
| 2009/0286478 A1 | 11/2009 | Biber et al. | |

FOREIGN PATENT DOCUMENTS

DE 10 2008 023 467 A1 12/2009
JP 6022928 A 2/1994

OTHER PUBLICATIONS

Du et al., "Correction of Concomitant Magnetic Field-Induced Image Artifacts in Nonaxial Echo-Planar Imaging", 2002, Magnetic Resonance in Medicine 48:509-515.*
MacFall et al. "Correction of spatially dependent phase shifts for partial Fourier imaging," 1988, Magn. Reson. Imaging. 6, 143-155.*
German Office Action dated Dec. 17, 2010 for corresponding German Patent Application No. DE 10 2010 013 681.6-54 with English translation.
Van den Berg, C. A. T., et al., "Simultaneous $B^+_1$ Homogenization and Specific Absorption Rate Hotspot Suppression Using a Magnetic Resonance Phased Array Transmit Coil," Magnetic Resonance in Medicine, 57: pp. 577-586, 2007.

* cited by examiner

*Primary Examiner* — Matthew Bella
*Assistant Examiner* — Jason Heidemann
(74) *Attorney, Agent, or Firm* — Lempia Summerfield Katz LLC

(57) ABSTRACT

The present embodiments relate to a device and a method for data postprocessing of K-space data acquired using a magnetic resonance tomography device. Each part of a K-space matrix is generated with one recording using a magnetic resonance tomography device in a plurality of recordings with the aid of a plurality of transmitting transmit channels of the magnetic resonance tomography device using excitation signals of one amplitude and phase. A field generated in total by the plurality of transmitting transmit channels is determined through addition of the spatial distribution of field distribution datasets representing a field generated by at least one transmit channel of the plurality of channels. A spatially dependent phase correction of the data is performed for data acquired in one recording using phases resulting from the added field distribution datasets.

28 Claims, 3 Drawing Sheets

CORRECTION OF CHANGING LOCAL TRANSMIT PHASES DURING PARALLEL TRANSMISSION

This application claims the benefit of DE 10 2010 013 681.6, filed Apr. 1, 2010.

BACKGROUND

The present embodiments relate to magnetic resonance tomography devices and methods for phase-correcting post-processing of data acquired using a magnetic resonance tomography device during a parallel transmission using a plurality of transmitting devices.

Magnetic resonance tomography devices are described, for example, in DE 102008023467 and U.S. Pat. No. 7,592,813.

In an MR imaging system, transmit phases (or time characteristics of transmitted signals) generated at every point of an area (e.g., a FoV or part of the FoV) may be given by the RF transmission profile of a coil. Phase relationships of transmitted signals generated by RF pulses in different voxels (e.g., three-dimensional points having a small volume) remain constant in time (e.g., during the application of each of the transmitted RF pulses). Global phase offsets, as used, for example, in RF spoiling, are spatially independent and may be corrected by a corresponding phase correction in the receiver or in the data postprocessing using a spatially independent phase correction. Global may be applicable to all transmitters.

In the case of a plurality of transmitters operated in parallel, the resulting B1 field may be varied in phase and amplitude in space (e.g., RF shimming) by adjustment of the phases and amplitudes of each individual transmitter. Phases induced via the RF excitation, which change locally from recording to recording (of an imaging session using the MRT system), overlay one another with the signal phases superimposed for spatial encoding and lead to spatial misregistrations and artifacts.

Spatial distribution of the (e.g., entire) RF field may not change (except for a global phase and amplitude) from one recording to the next. All (corresponding) pulses used for signal generation use the same phase and amplitude responses for the individual transmitters for each recording.

Individual RF pulses are optimized in terms of one criterion and are applied unchanged (except for a global phase and amplitude) in each recording. In conventional imaging using one transmit channel, the global phase and amplitude are a degree of freedom for exerting an influence of the resulting field. The phases generated during the signal generation may also be varied using gradients switched during the transmission. The multidimensionally selective pulses, which simultaneously modulate the gradient amplitude and RF envelope, are also not changed from recording to recording.

SUMMARY AND DESCRIPTION

The present embodiments may obviate one or more of the drawbacks or limitations in the related art. For example, MRT imaging may be optimized.

The present embodiments involve a correction changing local transmit phases during parallel transmission of a plurality of transmit channels.

In one embodiment, spatially dependent phase corrections are performed in subsets of k-space data. This enables transmit phases that change locally from recording to recording to be corrected. In other words, consistent spatial encoding of signals that are generated locally using different transmit phases is made possible.

The effect of changing transmit phases on signal generation is not taken into account.

The consistency of the spatial encoding resulting from the correction of the local transmit phase enables the RF pulses to be changed beyond a pulse sequence without producing spatial misregistration of signals. In the optimization of pulse sequences, this enables the RF excitation to be adapted (using RF signals and/or gradient signals) in each repetition. This is independent of any criteria with respect to which the pulse sequence is optimized. The criteria may be the image homogeneity with respect to the RF excitation or the minimization of local power that is absorbed beyond the pulse sequence.

DETAILED DESCRIPTION OF THE DRAWINGS

Figure 1:
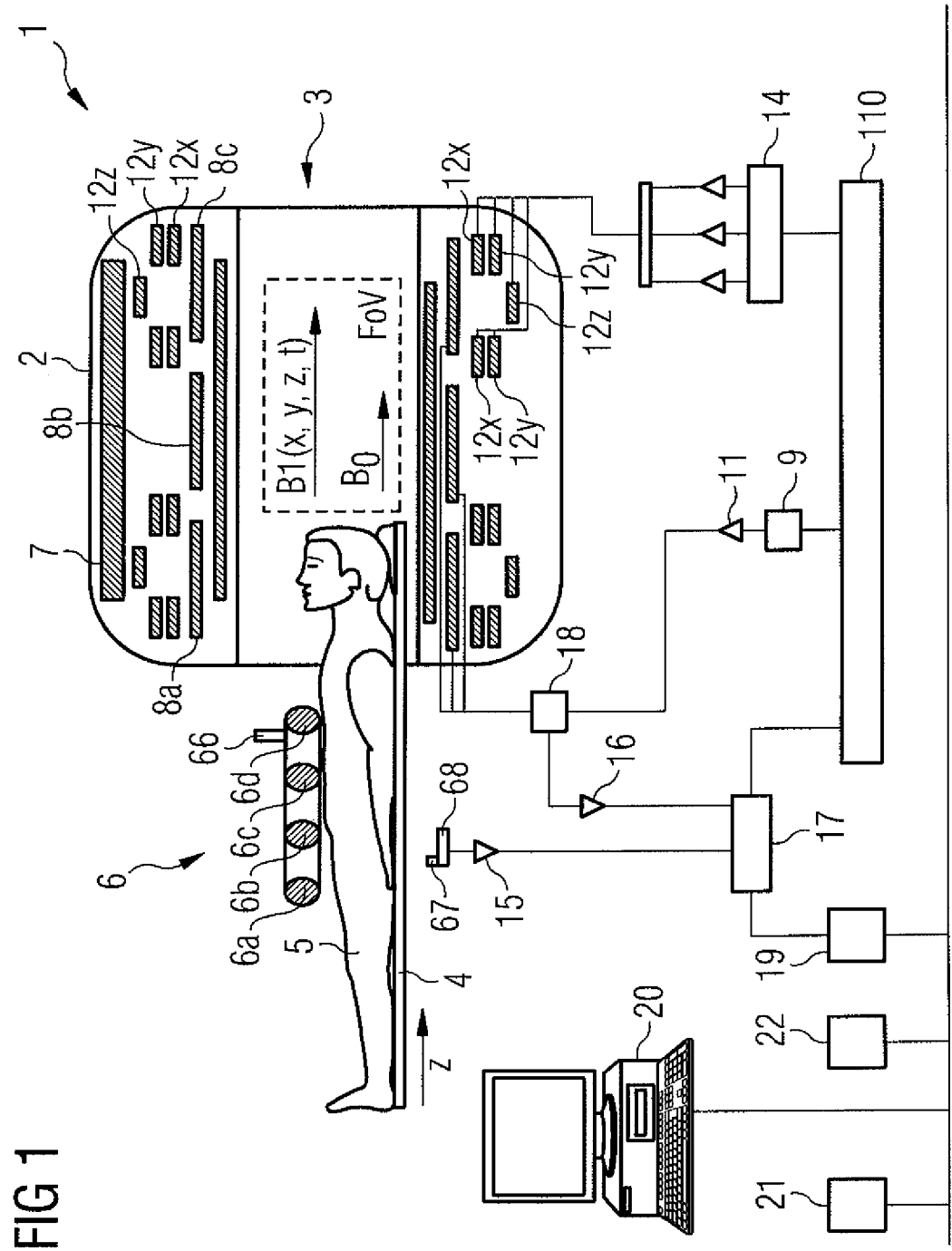
FIG. 1 shows a schematic overview of components of an MRT system.

FIG. 1 shows an overview of a magnetic resonance device MRT 1 that includes a whole-body coil 2 having a tubular space 3, into which a patient couch 4 supporting, for example, a patient 5 (e.g., a body) and a local coil array 6 may be moved in the direction of the arrow z in order to generate images of the patient 5. The local coil array 6 (e.g., having an antenna 66 and a plurality of local coils 6a, 6b, 6c, 6d) is placed on the patient 5, thereby enabling good images to be recorded in a local area (e.g., a field of view). Signals of the local coil array 6 may be evaluated (e.g., converted into images and/or stored and/or displayed) by an evaluation device (elements 19, 67, 66, 15 and 17) of the MRT 1. The evaluation device of the MRT 1 may be connected to the local coil array 6 via coaxial cable or wirelessly.

In order to examine the body 5 using magnetic resonance imaging using the magnetic resonance device MRT 1, different magnetic fields very precisely matched to one another in terms of temporal and spatial characteristics are radiated onto the body 5.

A strong magnet such as, for example, a cryomagnet 7 in a measurement chamber having the tunnel-shaped opening 3 generates a strong static main magnet field $B_0$ ranging from, for example, 0.2 Tesla to 3 Tesla or more. The body 5 that is to be examined is moved, supported on the patient couch 4, into a region of the main magnetic field 7 that is approximately homogeneous in the examination area or "field of view."

The magnetic resonance device MRT 1 has gradient coils 12x, 12y, 12z, using which magnetic gradient fields $B_x(x, y, z, t)$, $B_y(x, y, z, t)$, $B_z(x, y, z, t)$ are radiated in the course of an MRT measurement of the patient body 5 in order to produce selective layer excitation and for spatial encoding of the measurement signal. The gradient coils 12x, 12y, 12z are controlled by a gradient coil control unit 14 that is connected to a pulse sequence control unit 10.

The nuclear spins of atomic nuclei of the body 5 are excited via magnetic radio-frequency excitation pulses $B1_8(x, y, z, t)$, which are emitted via at least one radio-frequency antenna shown in a simplified form in FIG. 1 as a body coil 8 including body coil segments 8a, 8b, 8c. Radio-frequency excitation pulses of the body coil segments 8a, 8b, 8c are generated by a pulse generation unit 9, which is controlled by the pulse sequence control unit 10. Following amplification using a radio-frequency amplifier 11, the radio-frequency excitation pulses are routed to the radio-frequency antenna 8. The radio-frequency system shown in FIG. 1 is indicated only schematically. In other embodiments, more than one pulse generation unit 9, more than one radio-frequency amplifier 11 and a plurality of radio-frequency antennas or one multipart (shown in FIG. 1 in simplified form) radio-frequency antenna (e.g., in the form of a birdcage) having different numbers of radio-frequency antenna elements 8a, 8b, 8c are used in the magnetic resonance device MRT 1.

The radio-frequency antenna shown as the body coil 8 may include a plurality of transmit channels 8a, 8b, 8c. Each of the plurality of transmit channels 8a, 8b, 8c emits radio-frequency excitation pulses, where the fields $B1_{8a}(x, y, z, t)$, $B1_{8b}(x, y, z, t)$, $B_{8c}(x, y, z, t)$ generated by the transmit channel may each be individually measured or determined spatially (x, y, z) and temporally t (also by amplitude and phase) as B1 maps (e.g., spatial field distributions of a field generated by a transmit channel).

Fractions of the total field $B1(x,y,z,t)$ or non-stationary (e.g., without B0) total field $B1(x,y,z,t)$ may also be emitted in the form of radio-frequency excitation pulses $B1_8(x, y, z, t)$ by the plurality of transmit channels 6a, 6b, 6c, 6d of the local coil 6.

Fractions of the non-stationary total field $B1(x,y,z,t)$ may also be generated in the form of gradient fields $B1_{12,x}(x, y, z, t)$, $B1_{12,y}(x, y, z, t)$, $B1_{12,z}(x, y, z, t)$ by gradient coil channels 12x, 12y, 12z. Fractions of the total field may also be measured (and stored in one of the B1 maps) or, for example, determined by simulation (e.g., Bloch simulation data "Bloch" or extended phase graph algorithm data "phase graph").

The total field or the non-stationary (without B0) total field $B1_n(x,y,z,t)$ during a recording n of the MRT system may be determined, for example, at all sites of interest and/or time instants t through an addition of fractions (of the field) that are generated by the plurality of transmit channels 8a, 8b, 8c, 6a, 6b, 6c, 6d and/or gradient coil channels 12x, 12y, 12z.

The signals transmitted by the excited nuclear spins are received by the body coil 8 and/or by the local coils 6a, 6b, 6c, 6d, amplified by associated radio-frequency preamplifiers 15, 16, and processed further and digitized by a receiving unit 17. The recorded measured data is digitized and stored as complex numeric values in a k-space matrix. An associated MR image may be reconstructed using a multidimensional Fourier transform from the k-space matrix populated with values.

In the case of a coil that may be operated both in transmit and in receive mode (e.g., the body coil 8), correct signal forwarding is controlled using an upstream duplexer 18.

From the measured data, an image processing unit 19 (e.g., a data postprocessing unit) generates an image that is displayed to a user via an operator console 20 and/or stored in a memory unit 21. A central computer unit 22 controls the individual system components.

Figure 2:
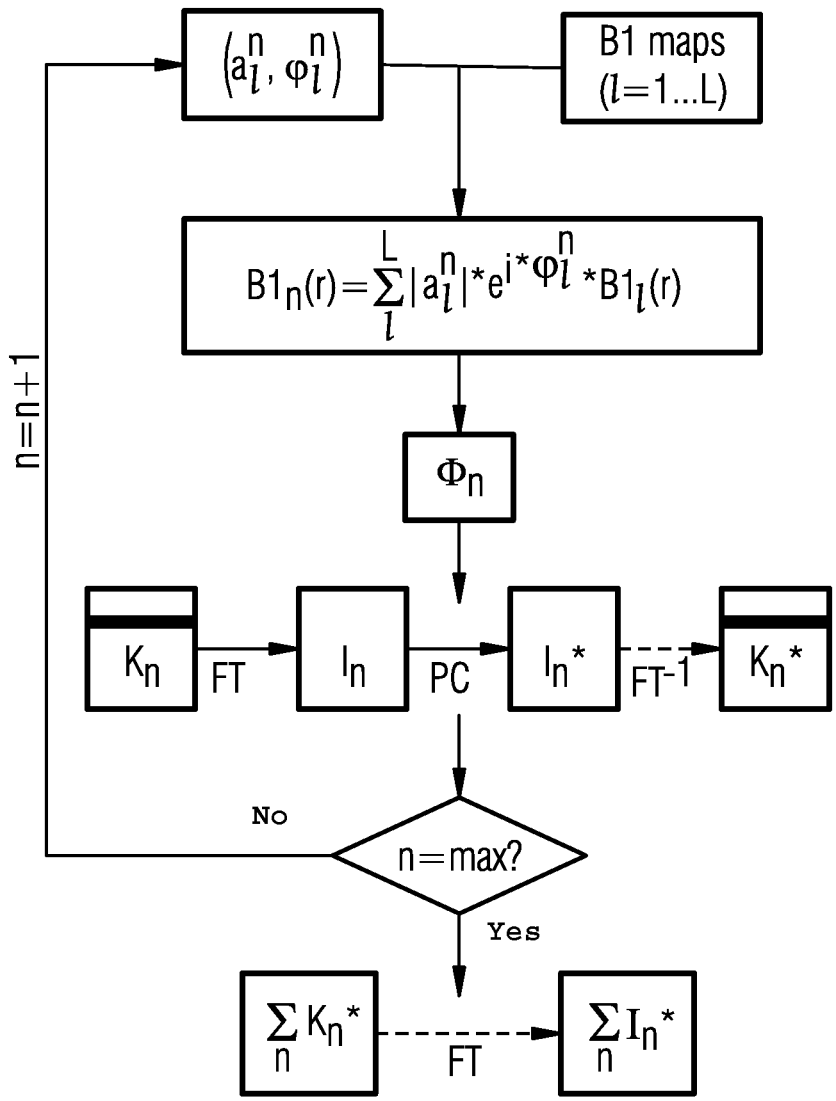
FIG. 2 shows a flowchart of one embodiment of a phase correction.
Figure 3:
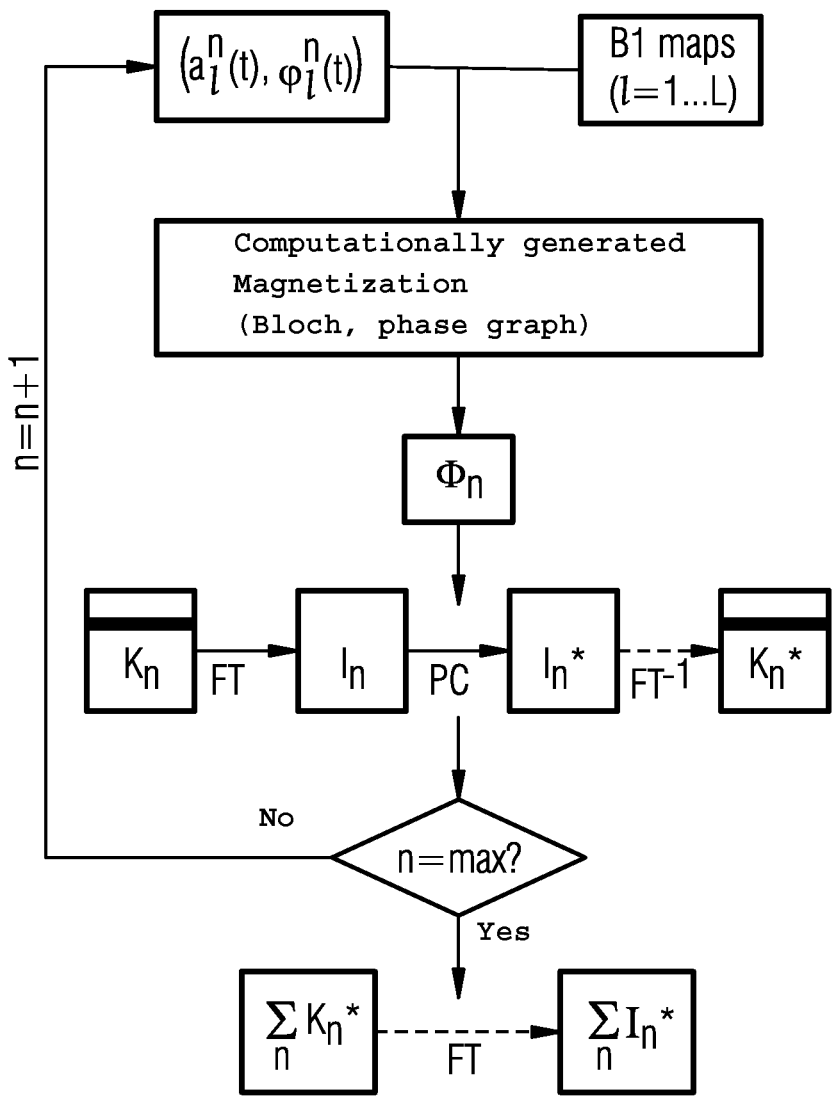
FIG. 3 shows a flowchart of another embodiment of a phase correction.

As FIG. 2 and FIG. 3 show, the present embodiments make provision for performing a spatially dependent phase correction for each recording n in the data postprocessing unit 19, as indicated in the flowcharts in FIG. 2 and FIG. 3.

For this purpose, "B1 maps" (e.g., maps of spatial and possibly temporal field distributions of the B1 field generated by a transmit channel) are used for each transmit channel of the plurality of transmit channels 8a, 8b, 8c, 8a, 6b, 6c, 6d (and if necessary, also for the gradient coils). In each recording n in the course of the generation of K-space data using the MRT system, a measurable transverse magnetization is generated with the aid of at least one RF pulse. The generated signals are spatially encoded and acquired with the aid of gradients 12x, 12y, 12z. The recorded data points form a subset (e.g., a row) of the k-space (e.g., the K-space matrix K). A specific phase correction for generating the signals is performed in each case using a subset $K_n$. FIG. 2 shows a calculation of the phase correction being used in the case of RF shimming (e.g., in the event that the same RF envelope is transmitted on all transmit channels of the plurality of transmit channels with a specific amplitude $a_l^n$ and phase $j_l^n$ for each of the 1=1–L channels, where n indexes the current recording). The resulting B1 field is produced as a complex (by absolute amount and phase) overlaying of the B1 fields of the individual channels (e.g., of the B1 field maps of the individual channels weighted with the corresponding amplitudes and phases). A spatial phase distribution $j_l^n$ (or $j_l^n(x,y,z)$) of the resulting (e.g., total) B1 field is the phase that is to be corrected. The phase correction for the data volume $(K_n)$ recorded in the n-th recording is performed, for example, as follows:

The recorded K-space points are entered in a k-space matrix. All remaining points of the k-space matrix are set to zero. The K-space matrix $K_n$, filled in this way is Fourier-transformed. The resulting image $I_n$ is multiplied point by point by $\exp(-i*f_n)$. The corrected part-image $I_n^*$ may be back-transformed into a phase-corrected subset of the k-space $K_n^*$.

After all data encoded in different recordings has been corrected with the corresponding transmit phases, the corrected data may be added to the resulting total image. The corrected sub-datasets may be added in the k-space or in the position space.

The correction described may also be performed in the k-space. The correction matrix is Fourier-transformed and folded with the corresponding K-space sub-matrix.

The image reconstruction may not be realized using a Fourier transform. Projection methods and reconstructions of the projection methods or iterative methods may also be used.

The phase used for the correction may also be relative to any arbitrary phase (e.g., to the transmit phase of the first excitation).

For multiple spin echo methods, each refocusing pulse may define one recording.

The method described above uses phases for the correction, the phases used for the correction resulting from the overlaying of fields generated using different transmitters (RF shimming). Signal phases that are induced, for example, using gradients switched during the excitation may also be corrected. The phase of the generated magnetization may be calculated, for example, using Bloch simulation or using extended phase graph algorithm methods, as shown in FIG. 3.

For precise calculation of the magnetization phases generated in a pulse sequence, it may also be advantageous to incorporate spatial maps of relaxation times.

The present embodiments include a computer program that is operable to be loaded directly into a non-transitory memory of the image processing unit 19 and/or another system component, with program code sections to execute all or some acts of the methods described above when the program is executed.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A method for phase correction of K-space data generated using a magnetic resonance tomography device, the method comprising:
   generating a part of a K-space matrix with each recording of a plurality of recordings, the plurality of recordings performed with a plurality of transmitting transmit channels of the magnetic resonance tomography device;
   determining a field generated by the plurality of transmit channels in the recording through addition of field distribution datasets, each of the field distribution datasets representing a spatial distribution of a field generated by one transmit channel of the plurality of transmit channels; and
   performing a spatially dependent phase correction of data for each recording of the plurality of recordings for data acquired in the recording using the plurality of transmit channels, the data acquired in the recording having a phase that results using a simulation from complex field strengths of the plurality of transmit channels.

2. The method as claimed in claim 1, wherein performing the spatially dependent phase correction of the data for the recording comprises using the plurality of transmit channels, the data for the recording having a phase that results from consolidated field distribution dataset values weighted with complex field strengths of the plurality of transmit channels in the recording.

3. The method as claimed in claim 1, wherein field distribution dataset values from the field distribution datasets are used, each of the field distribution dataset values being measured or calculated for one transmit channel of the plurality of transmit channels.

4. The method as claimed in claim 1, wherein the plurality of transmit channels include gradient coil channels of the magnetic resonance tomography device.

5. The method as claimed in claim 4, wherein a field distribution dataset for a gradient coil transmit channel contains Bloch simulation data, extended phase graph algorithm data, or Bloch simulation data and extended phase graph algorithm data.

6. The method as claimed in claim 1, wherein the plurality of transmit channels transmit at least partially overlapping in time.

7. A method for phase correction of K-space data generated using a magnetic resonance tomography device, the method comprising:
   generating a part of a K-space matrix with each recording of a plurality of recordings, the plurality of recordings performed with a plurality of transmitting transmit channels of the magnetic resonance tomography device;
   determining a field generated by the plurality of transmit channels in the recording through addition of field distribution datasets, each of the field distribution datasets representing a spatial distribution of a field generated by one transmit channel of the plurality of transmit channels;
   performing a spatially dependent phase correction of data for each recording of the plurality of recordings;
   transforming a subset of the K-space matrix into a part-image matrix; and
   multiplying elements of the part-image matrix by a factor representing a phase of a total field during a recording generating the subset of the elements at a place specified by an element, the multiplying yielding a phase-corrected part-image matrix,
   wherein the phase in the factor is determined from weighted added field distribution dataset values.

8. The method as claimed in claim 7, further comprising adding phase-corrected part-image matrices calculated for each recording of the plurality of recordings to form a phase-corrected image matrix.

9. The method as claimed in claim 8, further comprising adding phase-corrected part-image matrices calculated for each recording of the plurality of recording element by element to form a phase-corrected image matrix.

10. The method as claimed in claim 8, wherein the phase-corrected image matrices calculated for the recording are each Fourier-back-transformed in order to define a row of a phase-corrected K-space matrix, and
   wherein the phase-corrected K-space matrix filled with the rows is Fourier-transformed in order to obtain a phase-corrected image matrix.

11. The method as claimed in claim 10, further comprising performing an image reconstruction using projection methods and reconstructions or using iterative methods instead using Fourier transformation.

12. The method as claimed in claim 7, wherein the phase corrected part-image matrix is back-transformed into a phase-corrected subset of the K-space matrix using a Fourier back-transform.

13. A method for phase correction of K-space data generated using a magnetic resonance tomography device, the method comprising:
   generating a part of a K-space matrix with each recording of a plurality of recordings, the plurality of recordings performed with a plurality of transmitting transmit channels of the magnetic resonance tomography device;
   determining a field generated by the plurality of transmit channels in the recording through addition of field distribution datasets, each of the field distribution datasets representing a spatial distribution of a field generated by one transmit channel of the plurality of transmit channels; and
   performing a spatially dependent phase correction of the data for each recording of the plurality of recordings,
   wherein subsets of the K-space matrix are case folded with a correction matrix representing a Fourier-transformed matrix with phases for the plurality of transmit channels, resulting in a phase-corrected K-space matrix.

14. A method for phase correction of K-space data generated using a magnetic resonance tomography device, the method comprising:
   generating a part of a K-space matrix with each recording of a plurality of recordings, the plurality of recordings performed with a plurality of transmitting transmit channels of the magnetic resonance tomography device;
   determining a field generated by the plurality of transmit channels in the recording through addition of field distribution datasets, each of the field distribution datasets representing a spatial distribution of a field generated by one transmit channel of the plurality of transmit channels; and
   performing a spatially dependent phase correction of data for each recording of the plurality of recordings,
   wherein the plurality of transmit channels include RF transmit channels of the magnetic resonance tomography device,
   wherein a field distribution dataset for a RF transmit channel specifies a spatial distribution of a B1 subfield generated by the RF transmit channel spatially, by phase, or spatially and by phase.

15. A magnetic resonance tomography device image data processing unit comprising:

a memory storing parts of a K-space matrix each generated with a recording by a magnetic resonance tomography device in a plurality of recordings with a plurality of transmit channels of the magnetic resonance tomography device; and a device for processing K-space data acquired using the magnetic resonance tomography device, the device for processing K-space data comprising a calculation device and a phase correction device, wherein the calculation device of the device is configured such that a field generated by the plurality of transmit channels is determined through addition of field distribution datasets, the field distribution datasets each representing a spatial distribution of a field generated by at least one transmit channel of the plurality of transmit channels, wherein the phase correction device of the device is configured to perform a spatially dependent phase correction of the K-space data for recordings for data acquired in the recording of the plurality of recordings using the plurality of transmit channels, and wherein the spatially dependent phase correction of the K-space data for each recording of the plurality of recordings is performed for data acquired in the recording using the plurality of transmit channels, the data acquired in the recording having a phase that results using a simulation from complex field strengths of the plurality of transmit channels.

16. The magnetic resonance tomography device image data processing unit as claimed in claim 15, wherein the plurality of transmit channels transmit at least partially overlapping in time.

17. The magnetic resonance tomography device image data processing unit as claimed in claim 15, wherein the spatially dependent phase correction of the K-space data for each recording of the plurality of recordings is performed for data acquired in the recording using the plurality of transmit channels, the data acquired in the recording having a phase that results from consolidated field distribution dataset values weighted with complex field strengths of the plurality of transmit channels in the recording.

18. The magnetic resonance tomography device image data processing unit as claimed in claim 15, wherein field distribution dataset values from the field distribution datasets are used, the field distribution dataset values each being measured or calculated for only one transmit channel of the plurality of transmit channels.

19. The magnetic resonance tomography device image data processing unit as claimed in claim 15, wherein the device for processing K-space data is configured to add phase-corrected part-image matrices calculated for one recording of the plurality of recordings to form a phase-corrected image matrix.

20. The magnetic resonance tomography device image data processing unit as claimed in claim 15, wherein the plurality of transmit channels include RF transmit channels of the magnetic resonance tomography device.

21. The magnetic resonance tomography device image data processing unit as claimed in claim 20, wherein a field distribution dataset for one of the RF transmit channels specifies a spatial distribution of a B1 sub-field generated by the one RF transmit channel spatially, by phase, or spatially and by phase.

22. The magnetic resonance tomography device image data processing unit as claimed in claim 15, wherein the plurality of transmit channels include gradient coil transmit channels of the magnetic resonance tomography device.

23. The magnetic resonance tomography device image data processing unit as claimed in claim 22, wherein a field distribution dataset for a gradient coil transmit channel contains Bloch simulations data, extended phase graph algorithm data, or Bloch simulations data and extended phase graph algorithm data.

24. A magnetic resonance tomography device image data processing unit comprising:

a memory storing parts of a K-space matrix each generated with a recording by a magnetic resonance tomography device in a plurality of recordings with a plurality of transmit channels of the magnetic resonance tomography device; and a device for processing K-space data acquired using the magnetic resonance tomography device, the device for processing K-space data comprising a calculation device and a phase correction device, wherein the calculation device of the device is configured such that a field generated by the plurality of transmit channels is determined through addition of field distribution datasets, the field distribution datasets each representing a spatial distribution of a field generated by at least one transmit channel of the plurality of transmit channels, wherein the phase correction device of the device is configured to perform a spatially dependent phase correction of the K-space data for recordings for data acquired in the recording of the plurality of recordings using the plurality of transmit channels, and wherein the device for processing the K-space data is configured to:

transform a subset of the K-space matrix into a part-image matrix; and multiply elements of the part-image matrix by a factor representing a phase of a total field in the recording generating a subset of the elements at a place specified by an element, resulting in a phase-corrected part-image matrix, wherein a phase in the factor is determined from weighted added field distribution dataset values.

25. The magnetic resonance tomography device image data processing unit as claimed in claim 24, wherein the device for processing K-space data is configured to back-transform the phase-corrected part-image matrix into a phase-corrected subset of the K-space matrix using a Fourier back-transform.

26. The magnetic resonance tomography device image data processing unit as claimed in claim 25, wherein the device for processing K-space data is configured to perform an image reconstruction using projection methods and reconstructions or using iterative methods instead of using Fourier transformation.

27. The magnetic resonance tomography device image data processing unit as claimed in claim 24, wherein the device for processing K-space data is configured to Fourier-back-transform phase-corrected part-image matrices calculated for each recording of the plurality of recordings in order to define one row of a phase-corrected K-space matrix, and wherein the phase-corrected K-space matrix filled with the rows is Fourier-transformed in order to obtain a phase-corrected image matrix.

28. The magnetic resonance tomography device image data processing unit as claimed in claim 24, wherein the device for processing K-space data is configured to fold each subset of the K-space matrix with a correction matrix representing a Fourier-transformed matrix with phases for the plurality of transmit channels, resulting in a phase-corrected K-space matrix.

\* \* \* \* \*